United States Patent [19]

Taki

[11] Patent Number: 4,705,968
[45] Date of Patent: Nov. 10, 1987

[54] SEMICONDUCTOR INTEGRATED CIRCUIT DEVICE WITH HIGH BREAKDOWN VOLTAGE LEVEL

[75] Inventor: Youichirou Taki, Hyogo, Japan

[73] Assignee: Mitsubishi Denki Kabushiki Kaisha, Tokyo, Japan

[21] Appl. No.: 738,718

[22] Filed: May 29, 1985

[30] Foreign Application Priority Data

May 30, 1984 [JP] Japan ................................. 59-112491

[51] Int. Cl.[4] .................. H03K 19/088; H03K 3/313; H03K 3/33
[52] U.S. Cl. ..................................... 307/456; 307/300; 307/315; 307/317 A
[58] Field of Search ................... 307/317 A, 300, 254, 307/315, 456

[56] References Cited

U.S. PATENT DOCUMENTS 4,400,635  8/1983  Mazgy ............................ 307/317 A
4,581,550  4/1986  Ferris et al. .................... 307/317 A

FOREIGN PATENT DOCUMENTS 3248133  7/1983  Fed. Rep. of Germany .
59-51625  3/1984  Japan .

Primary Examiner—Stanley D. Miller
Assistant Examiner—B. P. Davis
Attorney, Agent, or Firm—Sughrue, Mion, Zinn, Macpeak & Seas

[57] ABSTRACT

A first npn transistor 4 becomes conductive when its input is at a first potential, and non-conductive when the input signal is at a second potential. A second npn transistor 6 is connected between an output terminal 7 and a low potential source 8; the base of the second transistor is connected to the collector of the first transistor. A Darlington circuit consists of third and fourth npn transistors 9 and 16a. The base of the third transistor is connected to the collector of the first transistor, and the collector of the third transistor 9 is connected to a high potential source 3. The emitter of the fourth transistor 16a is connected to the output terminal 7. The anode of a Schottky barrier diode 16b is connected to the base of the fourth transistor 16a, and the cathode of the Schottky barrier diode 16b is connected to the collector of the fourth transistor 16a.

5 Claims, 4 Drawing Figures

U.S. Patent  Nov. 10, 1987  4,705,968
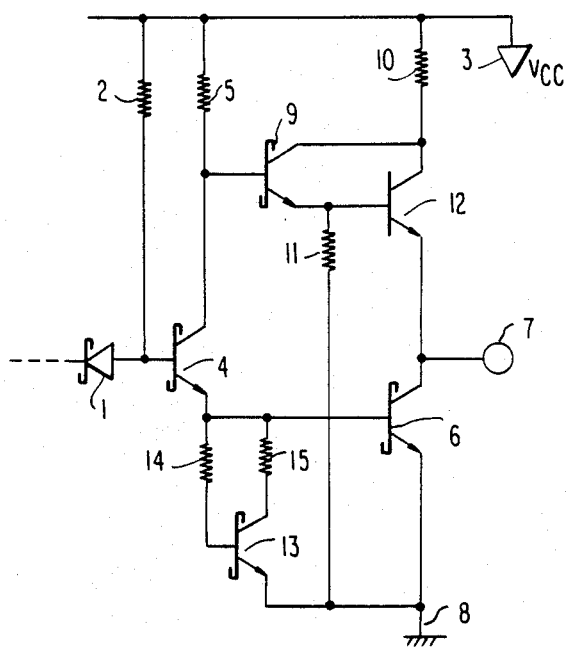
FIG. 1
PRIOR ART
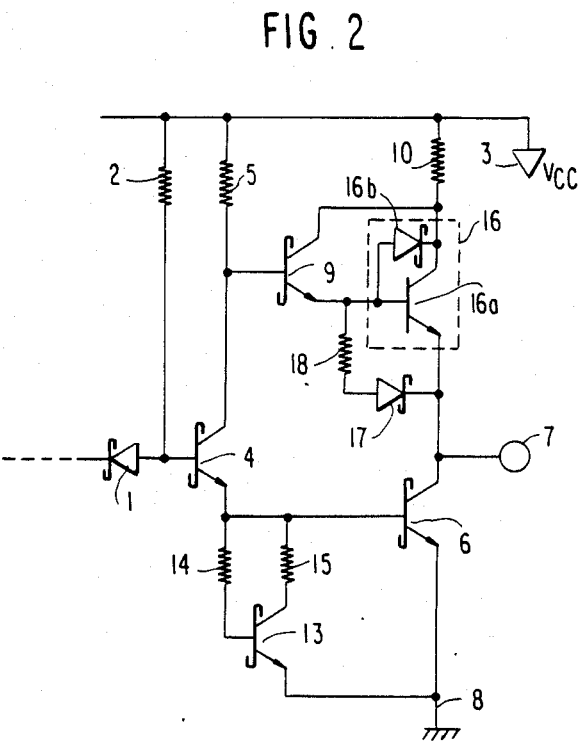
FIG. 2
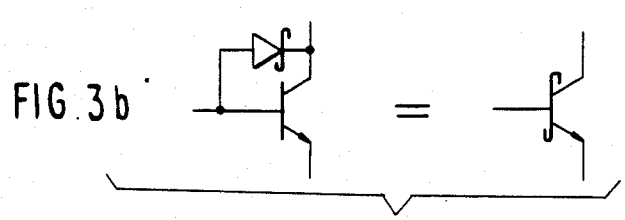
FIG. 3a
FIG. 3b

SEMICONDUCTOR INTEGRATED CIRCUIT DEVICE WITH HIGH BREAKDOWN VOLTAGE LEVEL

BACKGROUND OF THE INVENTION

This invention relates to a semiconductor integrated circuit device, and more particularly to an LSTTL (Low Power Schottky Transistor - Transistor Logic) output circuit with inreased breakdown voltage when the potential at the output terminal is high.

FIG. 1 shows a conventional LSTTL output circuit. In FIG. 1, an input signal is applied to the cathode of an SBD (Schottky Barrier Diode) 1. The anode of the SBD is connected through a resistor 2 to a high potential source 3. A first transistor 4 comprises an SBD npn transistor (Schottky clamped npn Transistor). The base of the first transistor is connected to the anode of the SBD, and the collector of the first transistor is connected through a resistor 5 to the thigh potential source 3. A second transistor 6 comprises an SBD npn transistor connected between an output terminal 7 and a low potential source 8, which is grounded. The base of the second transistor is connected to the emitter of the first transistor. A third transistor 9 also comprises an SBD npn transistor. The collector of the third transistor is connected through a resistor 10 to the high potential source 3, the emitter is connected through a resistor 11 to the potential source 8, and the base is connected to the collector of the first transistor. A fourth transistor 12 comprises an npn transistor connected between the collector of the third transistor 9 and the output terminal 7. The base of the fourth transistor is connected to the emitter of the third transistor.

A Darlington circuit comprising the third and fourth transistors 9 and 12 applies a current from the high potential source 3 to the output terminal 7 when the potential at the output terminal 7 is high. The resistor 11 drains the current at the base of the fourth transistor.

A fifth transistor 13 comprises an SBD npn transistor. The base of the fifth transistor 15 is connected through a resistor 14 to the emitter of the first transistor 4, the collector is connected through a resistor 15 to the base of the second transistor 6, and the emitter is connected to the low potential source 8. The fifth transistor 15 discharges the charge at the base of the second transistor 6.

In operation, a low level input signal is applied to the cathode of the SBD 1. At this time, current flows from the high potential source 3 to the resistor 2 and the SBD 1, so that the potential at the base of the first transistor 4 is lower than the sum of the base-emitter voltage $V_{BE4}$ of the first transistor 4 and the base-emitter voltage $V_{BE6}$ of the second transistor 6. As a result, the first and second transistors are non-conductive. On the other hand, the third transistor 9 is conductive and the current $I_{H11}$ flowing through the resistor 11 is expressed by the following formula (A).

$$I_{H11} = \{V_{CC} - V_{BE9}\}/R_{11} \qquad (A)$$

where $V_{CC}$ is the voltage of the potential source, $V_{BE9}$ is the base-emitter voltage of the third transistor 9, and $R_{11}$ is the resistance of the resistor 11. The third transistor 9 being conductive, the potential at the base of the fourth transistor 12 becomes sufficient to render the fourth transistor conductive. The second transistor 6 being non-conductive and the fourth transistor 12 being conductive, a high level potential develops at the output terminal 7.

When a high level input signal is applied to the cathode of the SBD 1, potential at the base of the first transistor 4 becomes higher than the sum of the base-emitter voltage $V_{BE4}$ of the first transistor 4 and the base-emitter voltage $V_{BE6}$ of the second transistor 6 so that the first and second transistors 4 and 6 become conductive. The third transistor 9 also is conductive and the current $I_{L11}$ flowing through the resistor 11 is expressed by the following formula (B).

$$I_{L11} = \{V_{sat4} + V_{BE6} - V_{BE9}\}/R_{11} \qquad (B)$$

where $V_{sat4}$ is the collector-base saturation voltage at the first transistor 4, and $V_{BE6}$ is the base-emitter voltage at the second transistor 6.

The fourth transistor 12 is non-conductive, because the current $I_{L11}$ flowing in the resistor 11 is very small and the potential at the base of the fourth transistor 12 is lower than the base-emitter voltage of the fourth transistor 12. As a result, the second transistor 6 becomes conductive and the fourth transistor 12 becomes non-conductive, so that the voltage at the output terminal 7 is low.

In general, the breakdown voltage $BV_{ECR}$ of an npn transistor is about 6 V and the breakdown voltage $BV_{CEO}$ of an SBD npn transistor is about 10 V, so that, in the prior art circuit, the breakdown voltage of the output circuit is determined by the breakdown voltage $BV_{ECR}$ of the fourth transistor 12 when the output at the output terminal 7 is high. Further, the breakdown voltage $BV_{ECR}$ of the fourth transistor 12 depends upon the value of the resistor and is higher when the value of the resistor is small. (The breakdown voltage $BV_{ECR}$ is calculated when the emitter of a transistor has a voltage applied thereto, and the resistor 11 is connected between the base and the standard voltage.)

On the other hand, when the voltage at the output terminal is high, part of the current consumption $I_{H11}$ flows from the high potential source 3 through the resistor 10, the base-emitter of the third transistor 9 and the resistor 11 to the low potential source 8. Accordingly, the current consumption depends upon the value of the resistor 11 and increases for a smaller vCalue of the resistor, as is obvious from the above formula (A).

As a result, the prior art device has the following disadvantages. When the output terminal voltage is high, the current consumption $I_{H11}$ increases if the value of the resistor 11 is decreased in order to raise the breakdown voltage of the output circuit, while the breakdown voltage becomes low if the value of the resistor 11 is made larger for lowering the current $I_{H11}$.

SUMMARY OF THE INVENTION

It is an object of the present invention to provide a semiconductor integrated circuit having an output circuit with a higher breakdown voltage.

It is a further object of the present invention to provide a semiconductor integrated circuit having an output circuit with a lower current consumption.

In order to accomplish these and other objects, the semiconductor integrated circuit device of the invention has an output circuit which develops high and low level potentials at the output terminal in response to high and low input signals. The output circuit has a Darlington circuit which is connected between a high potential source and the output terminal. A transistor comprising the last stage of the Darlington circuit is a Schottky clamped transistor, whereby the breakdown voltage of the output circuit is increased when the output at the output terminal is high.

BRIEF DESCRIPTION OF THE DRAWINGS

FIG. 1 is a circuit diagram of a conventional LSTTL output circuit;

FIG. 2 is a circuit diagram of an LSTLL output circuit in accordance with the present invention; and FIGS. 3a and 3b is a diagram to explain symbols used in the circuits of FIGS. 1 and 2.

DETAILED DESCRIPTION OF THE PREFERRED EMBODIMENT

In FIGS. 1 and 2, similar elements are similarly numbered. Referring to FIG. 2, a fourth transistor circuit 16 comprises an SBD npn transistor including an npn transistor 16a and an SBD 16b to increase the breakdown voltage of the npn transistor 16a. The anode of the SBD 16b is connected to the base of the transistor 16a, and the cathode of the SBD 16b is connected to the collector of the transistor 16a. The transistor 16a is further connected between the collector of the third transistor 9 and the output terminal 7, and the base of the transistor 16a is connected to the emitter of the third transistor 9. The Darlington circuit comprising the third and fourth transistors 9 and 16 applies a current from the high potential source 3 to the output terminal 7 when the output of the output terminal 7 is high. The anode of an SBD 17 is connected to the base of the transistor 16a through a resistor 18, and the cathode of the SBD 17 is connected to the output terminal 7. The SBD 17 is used for increasing the breakdown voltage of the fourth transistor 16 when the output at the output terminal 7 is high. The resistor 18 is provided for draining the current at the base of the transistor 16a. The resistor 18 may be replaced by the 5 resistance of the conductive layer during device fabrication.

When a low level input signal is applied to the cathode of SBD 1, current will flow from the high potential source 3 to the resistor 2 and the SBD 1, so that the potential at the base of the first transistor is lower than the sum of the base-emitter voltage $V_{BE4}$ of the first transistor 4 and the base-emitter voltage $V_{BE6}$ of the second transistor 6. As a result, the first and second transistors 4 and 6 become non-conductive. The potential at the base of the third transistor 9 is nearly the same as the potential at the high potential source 3, so that the third transistor 9 and the npn transistor 16a of the fourth transistor 16 become conductive. As a result, a high potential is applied to the output terminal. At this time, the second transistor 6 being non-conductive, current does not flow in the SBD 17 and the resistor 18, thereby resulting in lower current consumption at the circuit output.

When a high level input signal is applied to the cathode of the SBD 1, the potential at the base of the first transistor 4 is higher than the sum of the base-emitter voltage $V_{BE4}$ of the first transistor 4 and the base-emitter voltage drop $V_{BE6}$ of the second transistor 6, so that the first and second transistors 4 and 6 become conductive. As the SBD 17 and the second transistor 6 are connected between the emitter of the third transistor 9 and the low potential source 8, and as the first transistor 4 is conductive, the third transistor 9 becomes non-conductive. As the charge at the base of the npn transistor 16a is discharged through the resistor 18, the SBD 17 and the second transistor 6, the npn transistor 16a also becomes non-conductive. Consequently, a low level output appears at the output terminal 7.

In the output circuit according to the present invention, as the fourth transistor 16a comprises an SBD npn transistor circuit including the npn transistor 16a and the SBD 16b connected between the base and the collector of the npn transistor 16a, the breakdown voltage $BV_{CEO}$ of the fourth transistor is increased. As a result, the breakdown voltage of the output circuit is increased when the output at the output terminal 7 is high.

What is claimed is:

1. A semiconductor integrated circuit device comprising a first plurality of Schottky barrier diodes and a plurality of transistors, each of said transistors having a first terminal, a second terminal, and a third terminal and conducting through its first and second terminals, its third terminal comprising a base electrode to which a potential is applied to render the transistor conductive, said plurality of transistors comprising:

a first transistor having its third terminal connected to an input signal line and its first terminal connected to a first potential source;

a second transistor having its third terminal connected to the second terminal of said first transistor, its second terminal connected to a second potential source, and its first terminal connected to an output terminal;

a third transistor having its third terminal connected to the first terminal of said first transistor and its first terminal connected to said first potential source; and a fourth transistor having one of said first plurality of Schottky barrier diodes connected between its first and third terminals, its third terminal further connected to the second terminal of said third transistor, its second terminal connected to said output terminal, and its first terminal further connected to the first terminal of said third transistor, said first plurality of Schottky barrier diodes further comprising a second Schottky barrier diode connected between the first terminal of said second transistor and the third terminal of said fourth transistor.

2. A semiconductor integrated circuit device according to claim 1, further comprising a second plurality of diodes, each of said first, second, and third transistors having one of said second plurality of diodes connected between the first and third terminals thereof.

3. A semiconductor integrated circuit device according to claim 2, wherein each of said diodes in said first and second pluralities of diodes comprises a Schottky barrier diode.

4. A semiconductor integrated circuit device according to claim 1, further comprising an input diode connected between said input signal line and the third terminal of said first transistor.

5. A semiconductor integrated circuit device comprising:

a first schottky clamped npn transistor having its base connected to an input signal line and its collector connected to a first potential source;

a second schottky clamped npn transistor having its base connected to an emitter of said first schottky clamped npn transistor, its emitter connected to a second potential source, and its collector connected to an output terminal;

a third schottky clamped npn transistor having its base connected to the collector of said first schottky clamped npn transistor and its collector connected to said first potential source;

a fourth schottky clamped npn transistor having its base connected to an emitter of said third schottky clamped npn transistor, its emitter connected to said output terminal, and its collector connected to the collector of said third schottky clamped npn transistor; and a schottky barrier diode having its cathode connected to the output terminal and its anode connected to the base of said fourth schottky clamped npn transistor.

* * * * *